United States Patent [19]

Mendelsohn

[11] Patent Number: 5,488,731
[45] Date of Patent: Jan. 30, 1996

[54] SYNCHRONIZATION METHOD FOR LOOSELY COUPLED ARRAYS OF REDUNDANT DISK DRIVES

[75] Inventor: Noah Mendelsohn, Arlington, Mass.

[73] Assignee: International Business Machines Corporation, Armonk, N.Y.

[21] Appl. No.: 352,428

[22] Filed: Dec. 8, 1994

Related U.S. Application Data

[63] Continuation of Ser. No. 924,219, Aug. 3, 1992, abandoned.

[51] Int. Cl.⁶ ................................................. G06F 11/00
[52] U.S. Cl. .................. 395/800; 371/49.1; 371/47.1; 395/182.04; 395/182.12; 395/182.22
[58] Field of Search ................................. 395/800, 575; 364/DIG. 1; 371/66, 51, 13, 49.1, 68.1

[56] References Cited

U.S. PATENT DOCUMENTS

| | | | |
|---|---|---|---|
| T. 932,005 | 3/1975 | Kruskal | 235/153 |
| 4,393,500 | 7/1983 | Imazeki et al. | 371/13 |
| 4,410,942 | 10/1983 | Milligan et al. | 364/200 |
| 4,419,725 | 12/1983 | George et al. | 364/200 |
| 4,493,083 | 1/1985 | Kinoshita | 371/66 |
| 4,530,054 | 7/1985 | Hamstra et al. | 364/200 |
| 4,603,406 | 7/1986 | Miyazaki et al. | 365/229 |
| 4,654,819 | 3/1987 | Stiffler et al. | 364/900 |
| 4,697,266 | 9/1987 | Finley | 371/12 |
| 4,761,785 | 8/1988 | Clark et al. | 371/51 |
| 4,819,159 | 4/1989 | Shipley et al. | 364/DIG. 1 |
| 4,942,579 | 7/1990 | Goodlander et al. | 371/51 |
| 5,043,871 | 8/1991 | Nishigaki et al. | 364/200 |
| 5,051,887 | 9/1991 | Berger et al. | 364/200 |
| 5,195,100 | 3/1993 | Katz et al. | 371/66 |
| 5,233,618 | 8/1993 | Glider et al. | 371/68.1 |
| 5,305,326 | 4/1994 | Solomon et al. | 371/11.1 |
| 5,313,626 | 5/1994 | Jones et al. | 395/575 |
| 5,379,417 | 1/1995 | Lui et al. | 395/575 |

FOREIGN PATENT DOCUMENTS

WO90/06550  6/1990  WIPO.

OTHER PUBLICATIONS

Stonebraker et al., "Distributed Raid–A New Multiple Copy Algorithm", IEEE, 1990, pp. 430–437.
Schloss et al., "Highly Redundant Management of Distributed Data", Workshop on the Management of Replicated Data, IEEE, Nov. 1990, pp. 91–95.
D. Patterson et al., "A Case for Redundant Arrays of Inexpensive Disks (Raid)", ACM SIGMOD Conference, Chicago, Jun. 1988, pp. 109–116.

Primary Examiner—Alyssa H. Bowler
Assistant Examiner—Walter D. Davis, Jr.
Attorney, Agent, or Firm—Perman & Green

[57] ABSTRACT

A multiprocessor system includes a plurality of substantially identical nodes interconnected through a switching network, each node including a disk drive, NVRAM, and a processor. The system stores data in either a RAID or mirrored fashion across a plurality of disk drives in different nodes. When data is stored in a RAID arrangement, an NVRAM in a parity node is provided with an entry including the new data, a copy of old data from the node to which the new data is to be written, a copy of the old parity, and a synchronization state indicator. The parity node determines new parity and transmits the new data to the data node for storage. Upon receiving an acknowledgement, the parity node resets the synchronization indicator. When power-up occurs, after a power failure, the parity node scans its NVRAM for any entry and upon finding one with a non-reset state indicator, transmits the new data to a destination data node for entry thereby synchronizing the contents of data and parity nodes. In a mirrored system, NVRAM in only one node has a data identifier entered into its NVRAM so that, upon a power failure and subsequent power-up, that entry enables the system to know which disk drives are in a non-synchronized state, and to cause actions that result in re-synchronization.

13 Claims, 5 Drawing Sheets

SYNCHRONIZATION METHOD FOR LOOSELY COUPLED ARRAYS OF REDUNDANT DISK DRIVES

This is a continuation of application Ser. No. 07/924,219 filed on Aug. 3, 1992, now abandoned.

FIELD OF THE INVENTION

This invention relates to data storage on arrays of redundant disk drives and, more particularly, to a method for assuring data synchronization among redundant disk drives after a power failure.

BACKGROUND OF THE INVENTION

The term "disk array" is used herein to refer to a class of computer systems in which multiple magnetic disks are used, in parallel, to improve performance and reliability in the storage of data. The prior art has suggested that redundant arrays of inexpensive disks (RAID) offer an attractive alternative to large expensive disk drives and promise performance improvements of an order of magnitude. Patterson et al. in "A Case for Redundant Arrays of Inexpensive Disks (RAID)", ACM Sigmod Conference, Chicago, Ill. Jun. 1–3, 1988 pages 109–116, describe multiple levels of RAID systems to enable data redundancy and improve the reliability of disk array systems. The concept of "striping" is described by Patterson et al. and refers to the interleaving of data across a plurality of disk drives. The interleaving may be by bit, byte, word or block, with succeeding data elements placed upon succeeding disk drives in a "stripe" arrangement. In block striping systems, each block is written to a single disk, but subsequent blocks are scattered to other disks. Striping techniques improve performance, but not reliability. Increased reliability may be obtained through the storage of redundant error correcting codes on multiple drives of the disk array. Should an individual disk fail, such codes may be used to reconstruct the lost data, which data is then written to a replacement disk when one becomes available. The RAID system arrangements described by Patterson et al. describe several examples of redundancy that enable data recovery. One such RAID system employs "mirroring" and another employs "parity". Mirroring systems improve reliability by writing each block of data on at least two separate disk drives. Should one drive fail, there is then at least one other drive containing the same data and the system may continue to run with the remaining drive or else duplicate data may be reconstructed by copying the data to a replacement drive.

Parity disk systems provide redundancy by grouping several disks into a "parity group". All but one of the disk drives contain ordinary disk blocks, whereas blocks on the remaining disk drive are written to contain the bitwise exclusive OR sum (modulo 2) of the data in the corresponding blocks on the other drives. Then, if any single drive is lost, its data may be reconstructed by exclusive ORing the data on the remaining drives. Updates may be made by writing new data in the appropriate positions on the data disk drives and adding the differences, using an exclusive OR function, of the old and new data to the corresponding block on the parity disk drive.

In such mirror and parity systems, a synchronization problem arises upon the occurrence of a power failure and a subsequent power-up. Data is said to be "synchronized" across redundant disks when identical data is present on redundant disks. The data is said to be "unsynchronized" if data, which should be identical, is not. The problem on power-up is to determine, across redundant disks, which data is synchronous and which data is not.

Error correction techniques employing mirroring and parity systems therefore work well only if the data and the error correction codes are written consistently. It must never be the case, particularly after a system failure, that data and the error correction code which protects the data, are inconsistent. At the very least, it must be possible for the system to efficiently identify and correct any inconsistencies.

If all data is written by a central shared controller and if that controller obtains sufficient early warning that power is to be lost, synchronization may be insured by the controller prior to loss of power. However, shared controllers of this sort tend to represent a single point of failure, thereby limiting the overall reliability of the system. They also limit flexibility in sharing standby replacement drives among a large group of operational disks.

The problem becomes more complex in architectures wherein multiple disks are written asynchronously, typically by separate controllers which can reside on separate processing nodes that are connected by a communication network. Where such disks are used for transaction processing systems, the prior art has made provision for using high level software transactions logs to enable resynchronization of the various disks, following a system failure.

High speed random access memories (RAMs) have been used as buffers to improve the performance of disk systems. Such buffers, or caches, are often allocated from the main memory of the central processor controlling the disk drive or, they may be contained in and private to the disk controller circuitry. In either case, such buffers eliminate the need to repeatedly re-read frequently accessed data from the disk. Data is placed in the high speed buffer when first accessed and retained there as long as possible. When data is altered, the high speed buffer is modified and the changed data written immediately to disk to avoid the possibility of losing the data should the system, as a whole, fail. These types of data caches are know as "write through" caches.

Random access memories now exist whose contents are retained in the event of system failures. Certain semiconductor memories may be used as non-volatile memories through the use of battery back up or other reliable power sources. Other semiconductor memories are naturally stable when power is removed and will retain stored data in the event of a power failure without battery back up. The term "non-volatile RAM" (NVRAM) will be used herein to refer to all such memory devices. The IBM 3990 disk controller, for example, uses NVRAM to cache data for an extended period before writing it to disk. Should the system fail and be restarted, any information in the NVRAM cache is presumed to be more current than corresponding data on the disk itself.

The patent prior art contains a number of teachings concerning parity protected disk arrays and other redundant disk arrangements. U.S. Pat. No. 4,761,785 to Clarke et al. introduces the concept of parity protected disk arrays and associated optimizations. Clarke et al. also describe a technique whereby version information stored in data "headers" on disk support detection of version mismatches between data and associated parity blocks. Correction of such mismatches, in the event of a power failure and a subsequent power-up, is not considered. In U.S. Pat. No. 4,654,819 to Stiffler et al., redundant RAM is used in the implementation of a fault tolerant computer system. Updates to main memory are buffered, with changes being stored in a special cache unit until the program context switches or the cache fills. At that point, a two phase update protocol is employed to update first one, and then a second main memory, always leaving sufficient information that the operation can be restarted or aborted if either memory fails.

U.S. Pat. No. 4,942,579 to Goodlander et al. describe various RAID arrangements of striping across multiple disk drives and techniques for reconstruction of data should one such drive fail. The architecture described by Goodlander et al. employs a single, battery-backed "cache memory" for caching and fast writing. No provision is made, however, for back-up of the "cache" memory in the event of its failure.

In U.S. Pat. No. 5,051,887 to Berger et al., a mainframe disk controller is described that includes mirroring functions. NVRAM is used therein as a fast write and synchronization mechanism. The Berger et al. system includes a single NVRAM as a fast write buffer, along with a second volatile cache. The system insures that data resides in NVRAM and cache or NVRAM and one disk, before acknowledging a fast write. This protects against loss of a cache or NVRAM while the system operates and provides recovery should power be lost. The Berger et al. system does not provide any teaching as to how recovery is possible if NVRAM or a drive is lost during a power outage. Further, there is no teaching in Berger et al. regarding a provision for providing synchronizing data in the event of a failure in various RAID arrangements.

U.S. Pat. No. 4,603,406 to Miyazaki et al. teaches the resynchronizing of two memories, each of which has separate battery back-up and normally store the same data. If battery back-up is lost at any point during a power outage, the contents of the corresponding memory are not trustworthy. When the system later reacquires memory, a means is provided for noting which memories have lost their contents.

In U.S. Pat. No. 4,530,054 to Hamstra et al. a disk controller is described with a central cache wherein updates are accomplished in a store-in manner (the updates are retained in the cache for some period before being written to a permanent backing store). The Hamstra et al. system indicates to a host processor approximately how much data is at risk in cache should there be a power failure.

Other teachings regarding the performance of redundant data storage can be found in the following documents: Defensive publication T932,005 of V. J. Kruskal; U.S. Pat. Nos. 4,493,083 to Kinoshita, 4,393,500 to Imezaki et al., 5,043,871 to Nishigaki et al., 4,419,725 to George et al., 4,697,266 to Finley, 4,410,942 to Milligan et al.; PCT International Application WO 90/06550 to Hotle; and Japanese Patent 62-194557.

Accordingly, it is an object of this invention to provide a redundant arrangement of disk drives with an improved method of data synchronization in the event of power failure.

It is another object of this invention to provide an improved method of data synchronization for a redundant array of disk drives wherein the failure of a drive or cache memory during a power failure can be detected and recovered from.

SUMMARY OF THE INVENTION

A multiprocessor system includes a plurality of substantially identical nodes interconnected through a switching network, each node including a disk drive, NVRAM, and a processor. The system stores data in either a parity protected RAID or mirrored fashion across a plurality of disk drives in different nodes. When data is stored in a RAID arrangement, an NVRAM in a parity node is provided with an entry including the new data, a copy of the new parity, and a synchronization state indicator. The parity node determines new parity and transmits the new data to the data node for storage. Upon receiving an acknowledgement, the parity node resets the synchronization indicator. When power-up occurs, after a power failure, the parity node scans its NVRAM for any entry and upon finding one with a non-reset state indicator, transmits the new data to the destination data node for entry. In a mirrored system, NVRAM in only one node has a data identifier entered into its NVRAM so that, upon a power failure and subsequent power-up, that entry enables the system to know which disk drives are in a non-synchronized state.

DETAILED DESCRIPTION OF THE INVENTION

Figure 1:
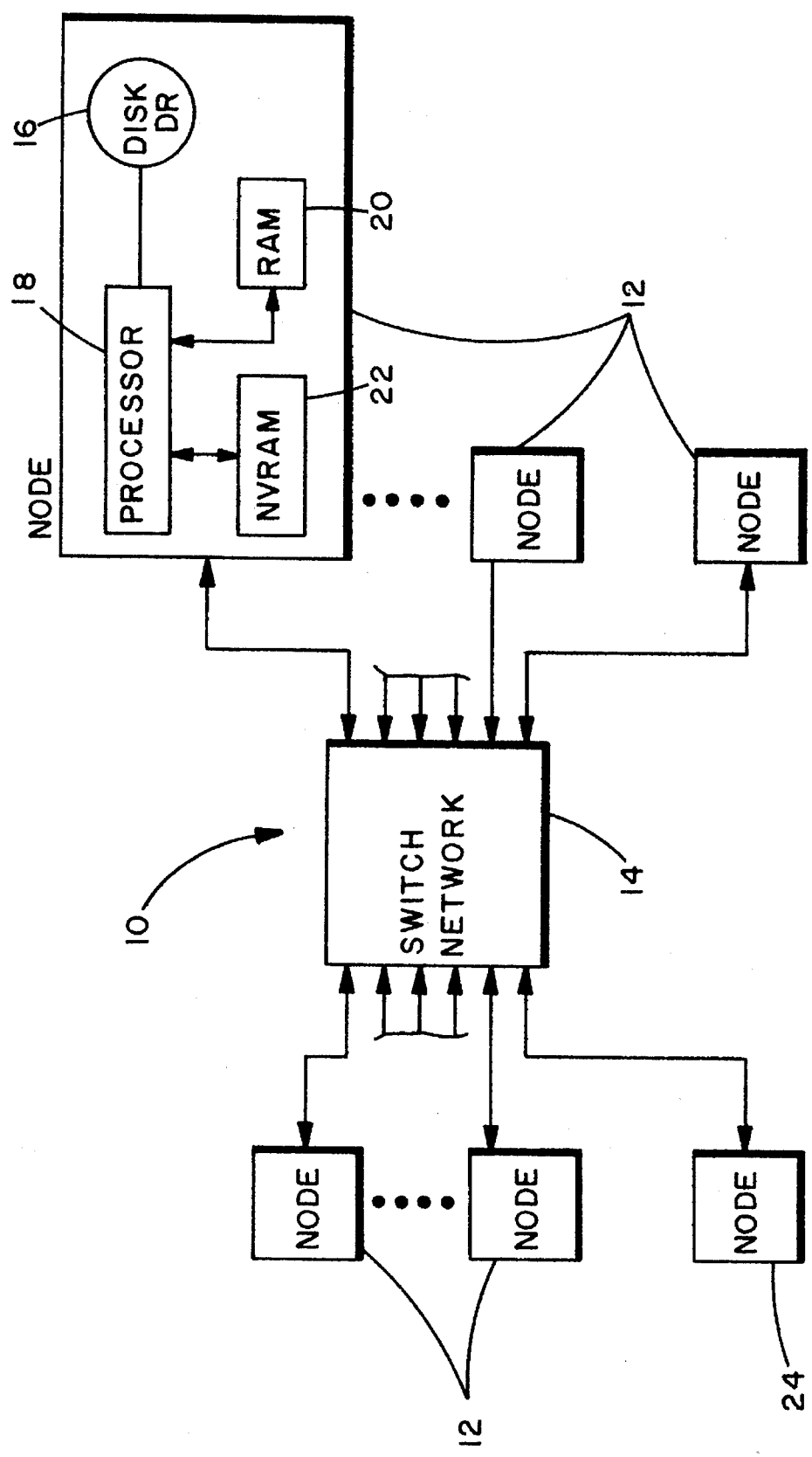
FIG. 1 is a high level block diagram of a system incorporating the invention.

Referring to FIG. 1, a multiprocessor system 10 comprises a plurality of nodes 12, each of which is substantially identical, all such nodes interconnected via a switch network 14. Each node 12 includes a disk drive 16, a processor 18, RAM 20 and an NVRAM 22. Processor 18, in the known manner, controls the operation disk drive 16, RAM 20, and NVRAM 22. The operation of system 10 is controlled by one or more nodal processors 18. The processor(s) may be located at a central controlling node, (e.g. node 24) or may be distributed throughout the nodal structure. Each node 12 must be accessible to a controlling node by means of switching network 14. Thus, any controlling node attempting to read or write a disk block must be in direct contact with all nodes in a parity group storing the block. In the alternative, the controlling node that attempts to read or write a disk block must be in contact with one of the disk nodes in the parity group, and the nodes in the parity group must be fully interconnected.

As will be hereinafter understood, this invention is directed at assuring data synchronization amongst nodes in the event of a failure of a particular node or in the event of an unexpected power failure, followed by a power-up. Any failure of a disk, its controlling processor, or its associated NVRAM, is considered to be a failure of the entire node and a recovery occurs accordingly. It is further presumed that transient power failures may cause a nearly synchronous halt of all system activities. It is presumed that most nodes will survive such a failure and reactivate when power is restored. It is also presumed that disk drives, processors, and NVRAMS will reliably report errors in their own operation or else exhibit fail-stop characteristics and further, that disks and NVRAMs will typically retain stored data during periods when power is lost, or else will report errors or fail stop when power is restored.

Figure 2:
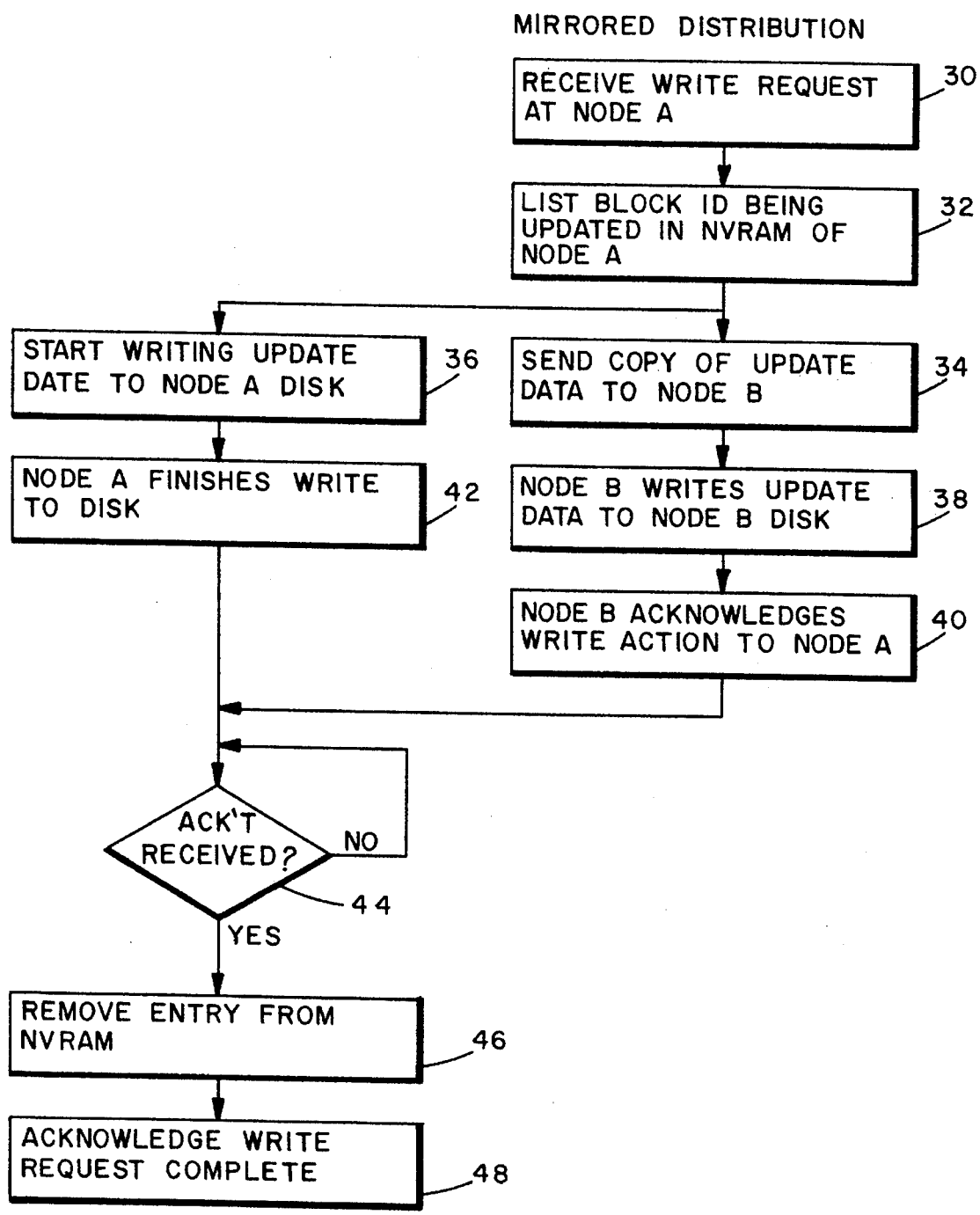
FIG. 2 is a flow diagram indicating the procedures followed by the system of FIG. 1, in the case of mirrored-redundant data distribution.

Referring to FIG. 2, the operation of system 10 (in the case of a mirrored disk drive system) will be described. Controlling software on a controlling node (e.g. node 24 in FIG. 1) initiates a logical block write by sending the block to one of the two nodes 12 that will store the data block. In this instance, it is assumed that node A receives the write request (see FIG. 2, box 30). Each node maintains a list in its NVRAM 22 of identifiers (but not necessarily the contents) of blocks being updated. Thus, upon node A receiving a write request, it adds the block identifier to its NVRAM list (block 32). Node A then sends a copy of the data block to the mirror node (i.e. Node B) and, simultaneously, commences writing the update data to its disk drive (boxes 34 and 36). Node B, upon receiving the update data, writes the data to disk (box 38) and then sends an acknowledgement to Node A (box 40). Node A also finishes its write to disk, in parallel (box 42), and then determines whether it has received an acknowledgement of a successful write from Node B (box 44). If not, it continues to test for the acknowledgement, or, in the alternative, may retry the data transmission.

Upon receiving an acknowledgement, Node A now knows that both its disk drive and the disk drive at node B contain the updated data. Under such circumstances, node A removes the block ID entry from its NVRAM 22 (box 46), and then acknowledges to the initiator of the write request that the write action is complete (box 48). Note that only one of the two nodes is required to store the block identifier for any given outstanding write. Some of the identifiers may be logged in one node and some in the other as long as each update is logged in at least one of the NVRAMs, until all drives have committed the change to disk.

The procedures shown in FIG. 2 assure that any out of synch data block will be listed in at least one NVRAM 22. Following a power failure (shown in FIG. 3), power is restored (box 50); all NVRAMs are checked; and any listed block found (box 52) is resynchronized by completion of any listed updates (box 54). Any block not listed in an NVRAM 22 is known to be in synch and need not be checked.

While the above description indicates two way mirroring, N-way mirroring (i.e. each block is stored on more than two nodes) may be employed, but the block identifier must be stored in N-1 of the NVRAMs 22. Under such a circumstance, there is some small chance that one or more of the mirroring nodes or its associated NVRAM may be lost while power is off. If fewer than N-1 failures occur, then it is guaranteed that all questionable blocks are noted in at least one surviving NVRAM 22 and recovery will proceed in the usual manner. If N-1 disk drives or NVRAMs fail simultaneously, then only one copy of the data survives and there is no synchronization issue to resolve.

The size of NVRAM 22 determines the number of updates which may be ongoing in the array at any one time. If NVRAM can contain only one entry, then only a single update may be outstanding and all copies of that block must be safely committed before any other writes are initiated. Typically, NVRAMs will have room for a number of block identifiers, and the number of identifiers indicates the number of writes that may be processed simultaneously.

Figure 3:
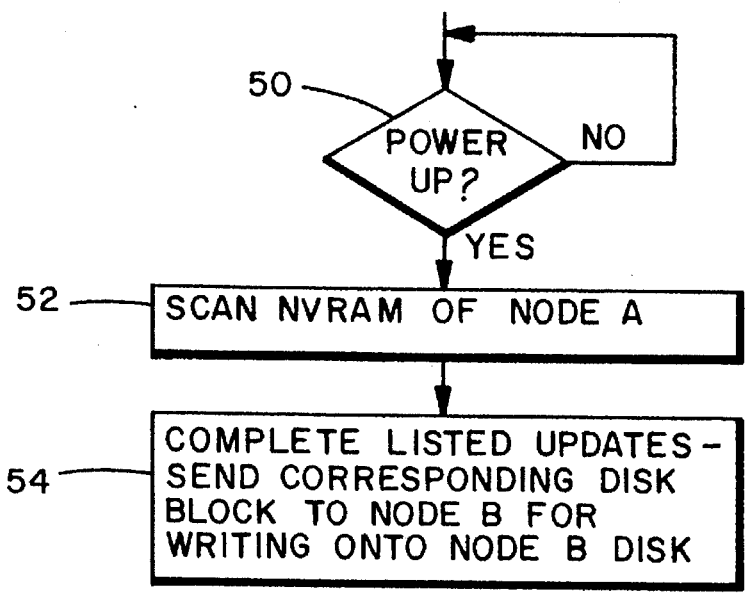
FIG. 3 is a flow diagram of the procedure followed by the system of FIG. 1 subsequent to a power-up in a mirrored data redundancy arrangement.

The system operation illustrated in FIGS. 2 and 3 may be optimized by combining the block identifier with a block cache in NVRAM. Each node may then have the option to have updated data written into its NVRAM along with the block identifier. Any or all of the nodes may store the data in NVRAM, and at least N-1 must store the block identifier. A write may be reported as complete to the controlling node as soon as an updated block is stored either in NVRAM or to disk on each node. Reads may be satisfied by obtaining data from the NVRAM when it is available and from disk, otherwise.

Figure 4B:
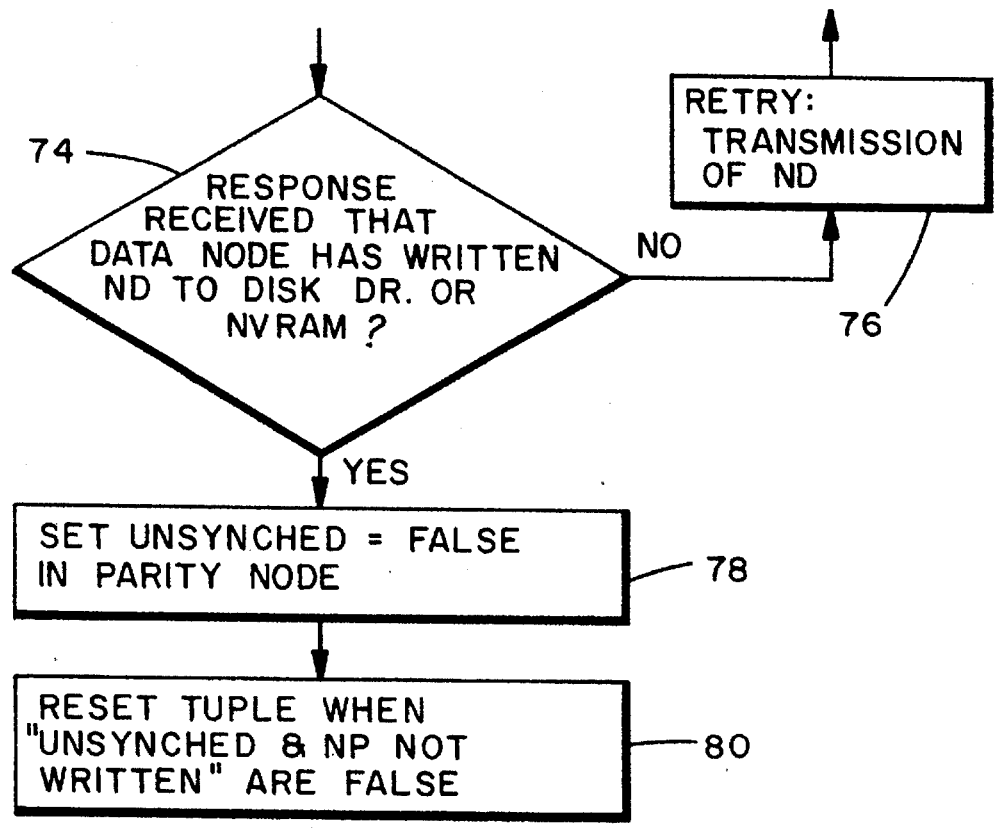
FIGS. 4a and 4b illustrate the procedure followed by the system of FIG. 1 when a RAID distribution of redundant data is employed.
Figure 4A:
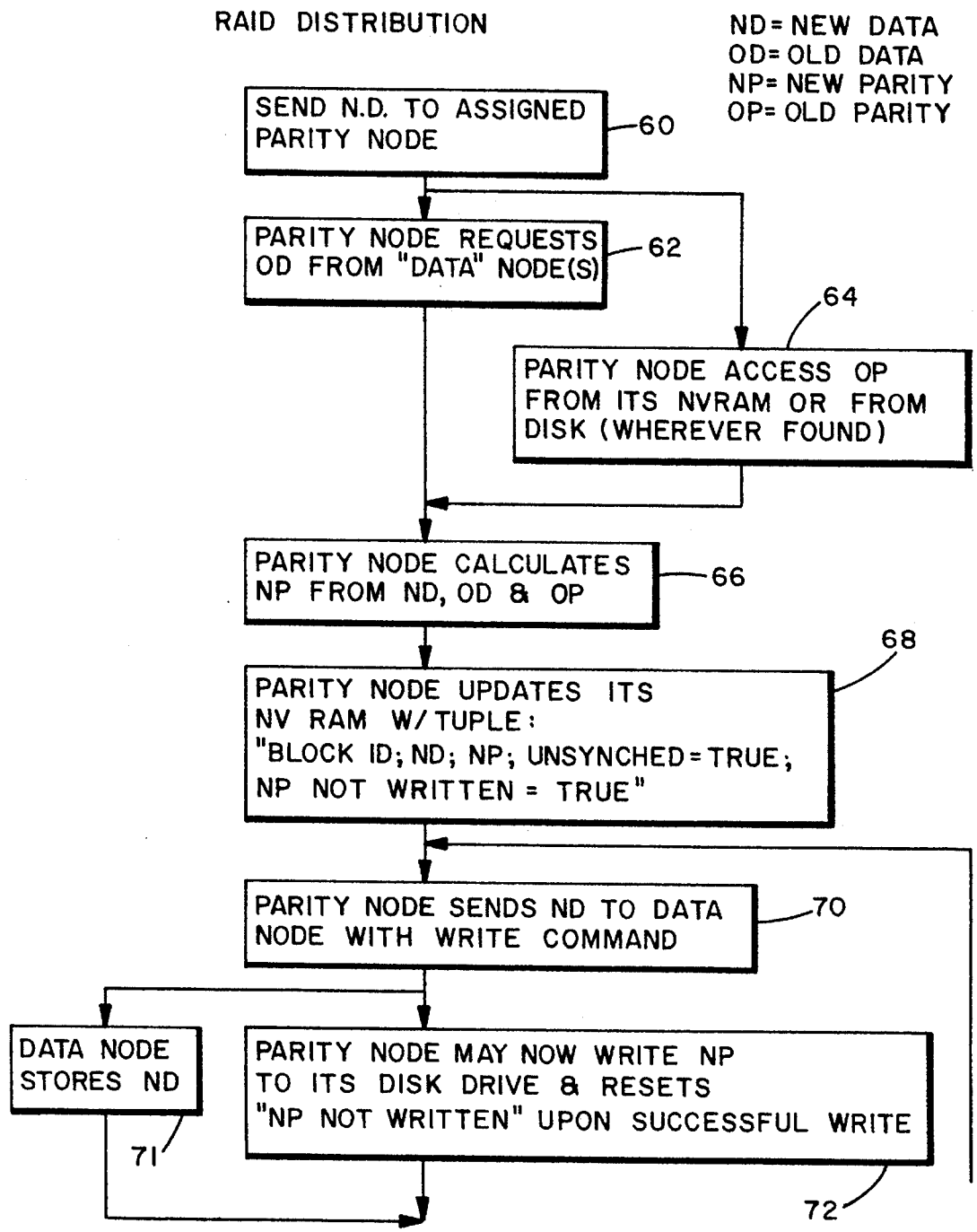

Turning now to FIGS. 4a and 4b, the operation of the invention will be described with parity protected disk arrays that are arranged in a RAID structure. As described above, such a system includes N disks, with N-1 disk drives used to store data and 1 disk drive used to store a parity code that is the Exclusive OR sum of the data on the other N-1 disk drives. During a read operation, data is read directly from some or all of the N-1 data nodes.

A data update results in a change to a data block on an appropriate one of the N-1 data disk drives and an update to the parity block on the parity disk drive. In such event, a new parity value (NP) on the parity disk must be set equal to the old value (OP) of the parity data plus the difference between the new data and old data (ND and OD), all computed bitwise, modulo 2 (exclusive OR).

As shown in FIG. 4a, data to be written (ND) is first sent by a controlling processor to a parity node (box 60). The parity node, in turn, contacts the data node to request the old value (OD) of data in the corresponding block (box 62). Simultaneously, the parity node (box 64) accesses the old value of the parity block (OP) from its NVRAM 22 or from its disk drive 16, wherever OP is found. The parity node then computes a new value for the parity block (NP) according to the formula NP=(OP+ND−OD), bitwise, and sum modulo 2 (box 66).

The parity node then updates its NVRAM with a "tuple" with all tuples ordered by time of creation. In this case, the tuple includes the following data: BLOCK ID, ND, NP, and two boolean (true/false) flags named UNSYNCHED, NP NOT WRITTEN. The tuple describes the data block identifier, the new value of the data (ND), the new value of parity (NP), an indicator that the referenced block may not be in synch at the data and parity nodes, and an indicator that the NP value has yet to be written to the disk drive at the parity node.

The parity node follows the following rules to maintain its tuple in NVRAM:

1. The BLOCK ID is set at the time a tuple is created and must be left intact until the tuple is deleted from NVRAM.

2. The UNSYNCHED flag is set at the time a tuple is created and must remain set until a response from the data node indicates that the new data (ND) has been committed to the data node's disk drive or NVRAM.

3. The NEW PARITY (NP) value may be written to disk at the parity node at any time following insertion of the corresponding tuple into the tuple list, or the write of new parity (NP) to disk may be delayed indefinitely, providing the tuple remains in the list with its NP value set. The NP NOT WRITTEN flag must remain set until the NP value has been written to disk and the flag is reset as soon as the disk write is complete.

4. Once the NP NOT WRITTEN flag is reset, space occupied by the NP data in the tuple may be reclaimed.

5. The ND value must be maintained in NVRAM at the parity site until the UNSYNCHED flag is reset or until the tuple is removed from the NVRAM. Once the UNSYNCHED marker is reset the space used for ND may be reclaimed.

6. The tuple itself is removed in its entirety once the following conditions are met: the UNSYNCHED marker is reset and NP NOT WRITTEN is reset.

As can be seen from the above, the UNSYNCHED indicator and ND must be retained at the parity node until the new data is safely committed at the data node. In this regard, as shown in box 70, the parity node sends ND to a data node with a write command and the data node stores ND (box 71). Then, the parity node may write NP to its disk drive and upon a successful write, resets NP NOT WRITTEN to a null (box 72).

Once the parity node receives a response from a data node (box 74) that it has written ND to its disk drive or NVRAM, the parity node may reset its UNSYNCHED flag (boxes 74 and 78). If no response is received of a successful write at the data node, the parity node retries transmission of ND (box 70). Once the UNSYNCHED entry in the tuple is reset to false, the entire tuple may be reset as shown in box 80.

Optionally, the NP and block ID may be retained in the NVRAM of the parity node indefinitely to serve as a cache for future reads and updates, with subsequent reads being satisfied from NVRAM without need to access the disk. Data may be retained for this purpose in NVRAM as long as sufficient space is available. Likewise, ND may be retained in NVRAM at the data node, as long as space is available.

In practice, many parity-based disk arrays mix parity and ordinary data on all disk drives (RAID-5). In such a system, a given disk drive stores data for some blocks and parity for others. The NVRAM system provided by this invention applies on a block by block basis, with each node taking the role of a data node or a parity node according to the particular block to be updated. The NVRAM at each node may serve the dual role of synchronization log (i.e. maintaining a tuple list) for parity blocks, and conventional write-behind cache for ordinary data blocks.

Figure 5:
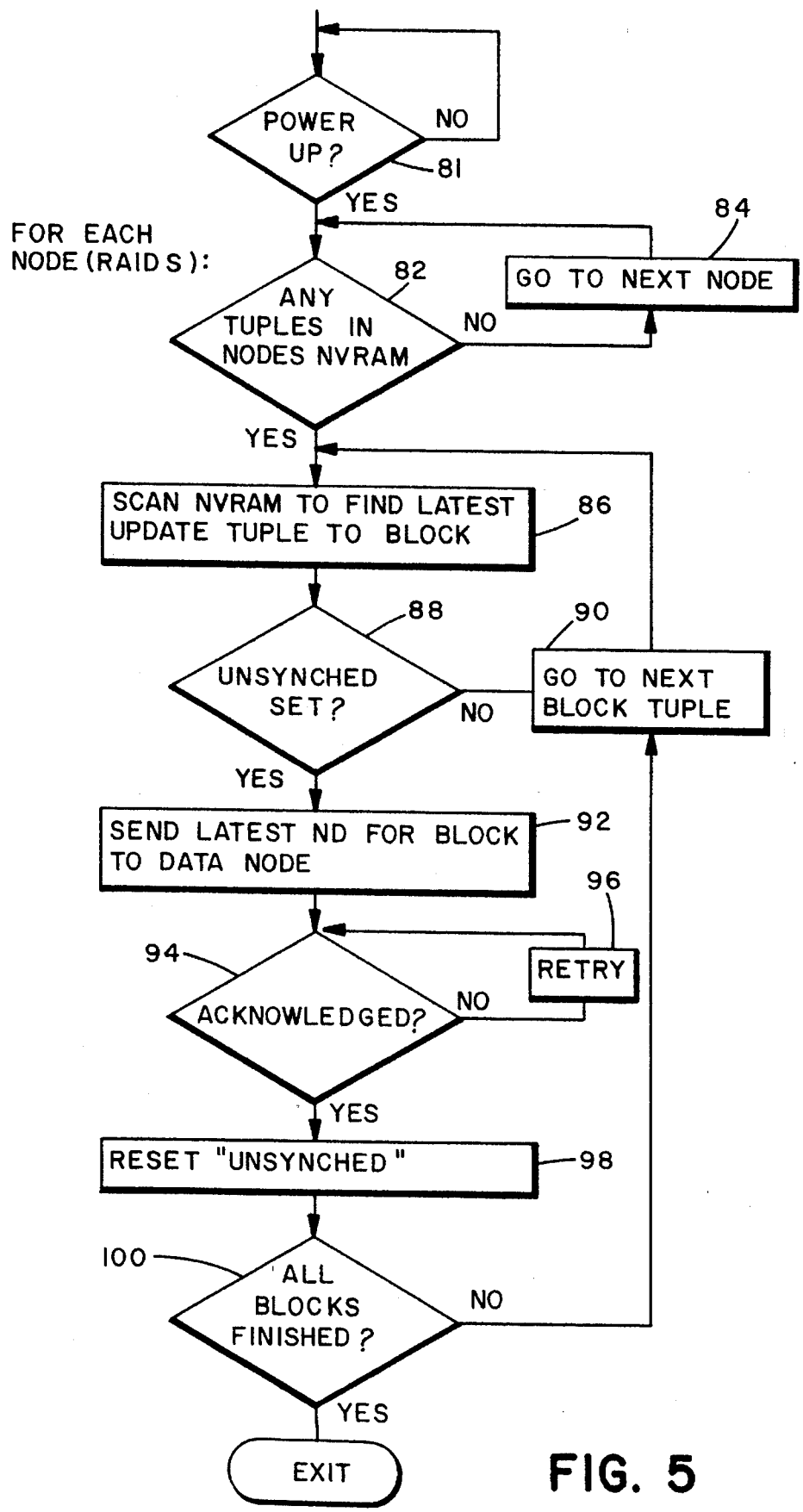
FIG. 5 is a flow diagram illustrating the procedure followed in a RAID-arranged system, subsequent to a power-up.

Turning now to FIG. 5, the procedure following a power failure will be described. Upon a power-up (box 81), each node's NVRAM is scanned to determine the presence of any tuples therein (box 82). If no tuple is found in a node, a next node is accessed and its NVRAM is scanned (box 84). Some implementations may scan the NVRAMs at several parity nodes in parallel.

Upon finding a tuple in an NVRAM, the respective NVRAM is scanned to find the latest update tuple to a particular data block (box 86). That tuple is then examined to determine if the UNSYNCHED bit is set (box 88) and if not, the next block'S ID tuple is accessed and the procedure recycles to box 86. If the UNSYNCHED bit is set, a message is sent to the data node containing the block including the new data (ND) (box 92) so that the data node may update its NVRAM cache or disk. If an acknowledgement to the transmission is not received (box 94), retransmission is retried (box 96) until an acknowledgement is received. At such point, the corresponding unsynched bit is turned off (box 98) and it is determined if all blocks are now finished and in synch. (box 100). If not, the procedure recycles back to box 90 and continues until decision box 100 issues a yes indication. At such time, the parity node may then commence normal operation, maintaining its tuple list according to the rules described above. In particular, the parity node may now write to its own disk the latest version of any uncommitted new parity values from its NVRAM and remove the corresponding tuples from its list, or it may retain some or all such tuples indefinitely as a cache.

In general, the system need not guarantee that all outstanding updates complete (i.e. updates for which no acknowledgement was sent to the controlling node prior to loss of power) following restoration of power, only that consistency be maintained. Any update logged in a surviving NVRAM is guaranteed complete following restoration of power. However, there is some chance that a parity node, its NVRAM, or its disk drive may fail to survive a loss of power. The disposition of any updates to such a node depends only on the progress of the corresponding data node. If a data node has cached or committed the update, then the update is considered complete. If not, the update is lost. In either case, there is no consistency problem. Since the parity node is lost, the data node is, by definition, consistent with itself. A new or replacement parity disk may be constructed by initializing each of its blocks to be the exclusive OR sum of all the data blocks which it protects. A lost data disk is reconstructed in the conventional "RAID" manner, i.e., by exclusive-ORing together the values of the surviving N-2 data blocks with the surviving parity block, using values from disk or NVRAM as appropriate.

A feature of the above procedure is that if a disk drive crashes or is lost during a power failure, sufficient data exists in the parity node to reconstruct the lost data from the crashed disk drive. Similarly, if the parity node fails, parity can still be reconstructed from the surviving disk drives.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A multiprocessor system including a plurality of substantially identical nodes interconnected through a switch network, each node comprising disk drive means, nonvolatile random access memory (NVRAM) and a processor, said multiprocessor system storing RAID-structured data across disk drive means in a plurality of different nodes, said system performing a method comprising the steps of:

a. listing at least an identifier of a data segment to be updated by received update data in an NVRAM in a first node in response to a command to write said update data to said data segment;

b. sending said update data from said first node to a second node containing a copy of said data segment;

c. removing said listing of said identifier in said NVRAM in said first node only when said update data is written to disk drive means in said first node and after receiving a signal that said second node has recorded said update data;

d. causing each node, in the event of a power-up, to scan its NVRAM to find any listed identifiers of data segments contained therein; and e. for any data segment denoted by a listed identifier in said NVRAM in said first node, causing a corresponding data segment in said second node to be in synchronism with said data segment denoted by said listed identifier in NVRAM in said first node.

2. The method as recited in claim 1 wherein step e uses said update data to enable an update action to be accomplished in said second node for each data segment that corresponds to an identifier of a data segment listed in NVRAM in said first node.

3. The method as recited in claim 1 wherein step e enables said disk drive means to store identical non-updated data segments.

4. The method as recited in claim 1 wherein each said data segment is a data block having a block identifier, said block identifier being listed in a said NVRAM if said data segment is in process of being updated.

5. The method as recited in claim 1 wherein step a, in addition to listing the identifier of said data segment in said NVRAM in first node, also lists said update data in said NVRAM in said first node.

6. The method as recited in claim 1 wherein step c only occurs after said second node has written said update data to its disk drive means.

7. A multiprocessor system including a plurality of substantially identical nodes interconnected through a switch network, each node comprising disk drive means, a nonvolatile random access memory (NVRAM) and a processor, said multiprocessor system storing RAID-structured data across disk drive means in a plurality of different nodes, said system performing a method comprising the steps of:

responding to a command to write new data to replace old data in a data segment stored in a first node, by storing in NVRAM in a different node which stores parity data corresponding to old data stored in said first node, an entry comprising said new data, a state indication, and a copy of new parity as calculated based upon an exclusive-or combination of old data from said first node, old parity from said different node and said new data;

transmitting said new data to said first node for storage therein, and upon receiving a signal acknowledging successful storage, causing said different-node to reset said state indication; and causing said different node, in the event of a power-up to scan its NVRAM for a said entry, and upon finding a said entry with a non-reset state indication, transmitting said new data to said first node.

8. The method as recited in claim 7 wherein a said state indication indicates an unsynchronized state, said entry including a further state indication which, when set, indicates that new parity has not yet been written to disk in said different node's disk drive means.

9. The method as recited in claim 8 wherein said data segment is a block of data and a said entry includes an identifier of said block of data.

10. The method as recited in claim 9 wherein said different node, upon scanning its NVRAM at power-up, first accesses an entry having oldest received new data for said block of data in said first node and proceeds to process subsequent entries in time order.

11. The method as recited in claim 10 wherein said different node, upon receiving an acknowledgement of a successful storage of new data by said first node, resets said unsynchronized state indicator.

12. A multiprocessor system including a plurality of substantially identical nodes interconnected through a switch network, each node comprising disk drive means, nonvolatile random access memory (NVRAM) and a processor, said multiprocessor system storing RAID-structured data across a disk drive means in a plurality of different nodes, said system comprising:

means for listing at least an identifier of a data segment to be updated by update data in an NVRAM in a first node in response to a command to write said update data to said data segment in said first node;

means for sending said update data from said first node to a second node containing a copy of said data segment;

means for removing said listing of said data segment in said NVRAM in said first node only when said update data is written to disk drive means in said first node and after receiving a signal that said second node has recorded said update data;

means for causing each node, in the event of a power-up, to scan its NVRAM to find any listed identifiers of data segments contained therein; and means, responsive to finding a data segment identifier listed in said NVRAM in said first node, for causing a corresponding data segment in said second node to be in synchronism with said data segment listed in said NVRAM in said first node.

13. A multiprocessor system including a plurality of substantially identical nodes interconnected through a switch network, each node comprising disk drive means, a nonvolatile random access memory (NVRAM) and a processor, said multiprocessor system storing RAID-structured data across disk drive means in a plurality of different nodes, said system comprising:

means for responding to a command to write new data to replace old data in a data segment stored in a first node, by storing in NVRAM in a parity node which stores parity data corresponding to data stored in said first node, an entry comprising said new data, a state indication, and a copy of new parity as calculated based upon an exclusive-or combination of old data from said first node, old parity from said parity node and said new data;

means for transmitting said new data to said first node for storage therein, and upon receiving a signal acknowledging successful storage, causing said parity node to reset said state indication; and means for causing said parity node, in the event of a power-up to scan its NVRAM for a said entry, and upon finding a said entry with a non-reset state indication, to transmit said new data to said first node.

* * * * *